PROCESS FOR MAKING FUSED JUNCTION SEMICONDUCTOR DEVICES

Filed Jan. 3, 1955 3 Sheets-Sheet 1

INVENTOR.
RICHARD A. GUDMUNDSEN
BY
Henry Heyman
ATTORNEY

INVENTOR.
RICHARD A. GUDMUNDSEN
BY
Henry Heyman
ATTORNEY

PROCESS FOR MAKING FUSED JUNCTION SEMICONDUCTOR DEVICES

Filed Jan. 3, 1955 3 Sheets-Sheet 3

INVENTOR.
RICHARD A. GUDMUNDSEN
BY Henry Heyman
ATTORNEY

1

2,815,304

PROCESS FOR MAKING FUSED JUNCTION SEMICONDUCTOR DEVICES

Richard A. Gudmundsen, Inglewood, Calif., assignor to Hughes Aircraft Company, Culver City, Calif., a corporation of Delaware Application January 3, 1955, Serial No. 479,316

19 Claims. (Cl. 148—1.5)

The present invention relates to semiconductor devices, and more particularly to fused junction semiconductor devices forming a P-N or N-P junction, and to a method of producing such semiconductor devices.

In the semiconductor art, a region of semiconductor material containing an excess of donor impurities and yielding an excess of free electrons is considered to be an N-type region, while a P-type region is one containing an excess of acceptor impurities resulting in a deficit of electrons or, stated differently, an excess of holes. When a continuous solid specimen of semiconductor material has an N-type region adjacent a P-type region, the boundary between the two regions is termed a P-N or N-P junction, and the specimen of semiconductor material is termed a P-N or N-P junction semiconductor device. A specimen having two N-type regions separated by a P-type region, for example, is termed an N-P-N junction semiconductor device, while a specimen having two P regions separated by an N-type region is termed a P-N-P junction semiconductor device.

The term, "monatomic semiconductor material," as utilized herein is considered generic to both germanium and silicon, and is employed to distinguish these semiconductors from metallic oxide semiconductors such as copper oxide. Although the invention will be disclosed with particular reference to silicon, it is to be understood that germanium can also be employed in the junction type semiconductor devices of the present invention.

The term, "active impurity," is used to denote those impurities which affect the electrical rectification characteristic of monatomic semiconductor material as distinguishable from other impurities which have no appreciable effect upon these characteristics. The term, "doping agent," has become synonymous in the art with the term, "active impurity." Generally speaking, active impurities are added intentionally to the base semiconductor material, although in many instances certain of these impurities may be found in the unrefined semiconductor material. Active impurities are ordinarily classified either as donor impurities, such as phosphorus, arsenic, and antimony, or as acceptor impurities, such as boron, aluminum, gallium, and indium. Crystal lattice defects which act as traps or recombination centers for electrons may also be classified as acceptor impurities.

The term, "solvent metal," is used in this specification to describe those metals which when in the liquid state become solvents for the semiconductor material which is under consideration, and will therefore dissolve areas of semiconductor material which are in contact with the solvent metal. A solvent metal may be a primary element or it may be an alloy. For example, the element antimony is a solvent metal with respect to both germanium and silicon, and an alloy mixture of antimony and gold is also a solvent metal with respect to germanium and silicon.

In the prior art method of producing a fused P-N or N-P junction in a semiconductor body, a metal specimen,

2 ordinarily in pellet form, containing a solvent metal and including an acceptor or donor impurity, is melted or fused onto one surface of a heated semiconductor body, forming a molten drop which dissolves a small portion of said body, the dissolved portion of the semiconductor body forming an alloy solution with the molten metal specimen. Ordinarily the metal specimen has a relatively low melting point or at least a low eutectic temperature with the semiconductor material, this being desirable so that fusion can be effected readily without raising the temperature of the semiconductor body to values that might injure the electrical characteristics of the semiconductor body. To form the junction region the assembly which comprises the semiconductor body and the drop of molten solvent metal is allowed to cool.

As the temperature drops, the solubility of the dissolved semiconductor material in the solvent metal drop decreases and, as a result, some of the dissolved semiconductor material, together with some atoms of the active impurity contained in the solvent metal specimen, begins to precipitate out of the liquid metal solution, depositing preferentially on the parent semiconductor crystal body to form a regrown crystal region of opposite conductivity type to that of the parent crystal. As the temperature is further decreased, the remainder of the solvent metal and dissolved semiconductor material solidifies as an alloy button affixed to the regrown region. By repeating or simultaneously performing the described process on the opposite surface of the semiconductor body, a P-N-P or N-P-N junction transistor is produced.

One of the principal disadvantages of the prior art method hereinabove described has been that the practice of this method is restricted to the use of solvent metals which are fairly soft in the solid state and which do not differ greatly in their thermal coefficients of expansion from that of the semiconductor material. If solvent metals which did not satisfy these criteria were used, the parent crystal was usually cracked or crazed at the junction region by the alloy button as it solidified, which seriously and deleteriously affects the electrical characteristics of the final semiconductor device.

Another disadvantage of the prior art method has been that the temperature of the semiconductor device could not safely be raised above relatively low values because the alloy button which is affixed to the regrown region tends to soften or melt if the temperature is again raised to the eutectic temperature of the alloy button. The softened or molten alloy button can easily cause electrical short circuits across the P-N junction which has previously been formed and may disturb the effectiveness of the P-N junction in other ways. Thus, in the prior art method, high temperature treatments aimed at annealing the semiconductive body after junction formation or at fusing or sealing portions of an enclosing envelope, were extremely difficult to accomplish and could only be effected through the use of critical temperature control because of the severe danger that the alloy button might melt or soften and thereby injure the electrical characteristics of the semiconductor device.

Still another disadvantage of the prior art method for formation of fused junction devices was that it was necessary to accurately control the rate at which the assembly of the semiconductor body and alloy button was cooled in order to control both the thickness of the regrown crystal region and to control the final concentration of active impurity or doping agent in the regrown region. The rate at which the assembly is cooled determines the percentage of the dissolved semiconductor material which is precipitated out of the molten alloy button to form the regrown region. Furthermore, the rate at which the assembly is cooled determines the percentage of the doping agent originally in the solvent metal pellet which will precipitate out with the semiconductor material into the regrown region.

If the assembly is cooled too rapidly, almost all of the dissolved semiconductor material and doping agent will precipitate in the solidified alloy button rather than in the regrown region. The regrown region may then have insufficient thickness and may have too small a conductivity or even may be of the same conductivity type as the parent crystal rather than being of the conductivity type which is determined by the doping agent in the alloy pellet. If the assembly is cooled too slowly, the thickness of the regrown region may be too great and the concentration of doping agent in the regrown region may be excessive. In practice, precise control of rate of cooling of the semiconductor body is very difficult to obtain and, as a result, in the prior art, precise control of thickness of the regrown region and of concentration of doping agent in the regrown region has never been possible.

It is therefore an object of the present invention to provide a fused junction semiconductor device which can safely be subjected to high temperature treatment after junction formation.

It is another object of the present invention to provide a fused junction semiconductor device produced through fusion of a solvent metal specimen with a body of semiconductor material, said device comprising a parent crystal body of one conductivity type having a regrown crystal region of opposite conductivity type, the regrown region being free of significant quantities of the solvent metal, whereby said fused junction semiconductor device is capable of being safely subjected to high temperature treatment after junction formation.

It is a further object of the invention to provide a fused junction semiconductor device in which the regrown crystal region of the device has never had a solidified alloy button affixed thereto, the junction area of the semiconductor device thereby being unusually free of cracks and crystal deformations.

It is still another object of the invention to provide a fused junction semiconductor device produced through fusion of a metal specimen containing a solvent metal and an electrically conductive metal to a body of semiconductor material, in which the regrown crystal region of the device is substantially free of microscopically significant quantities of the solvent metal and has a thin cap of the electrically conductive metal ohmically affixed or connected thereto, and in which the junction area of the semiconductor device is unusually free of cracks and of crystal deformations.

It is yet another object of the invention to provide a new and improved method of producing a fused junction semiconductor device in which method a solidified alloy button is never formed on the regrown crystal regions of the device, thereby producing a fused junction device which may be safely subjected to high temperature treatment after junction formation and in which the junction area is unusually free from cracks and crystal deformations.

Still a further object of the invention is to provide a method of producing a fused junction semiconductor device having a thin cap of an electrically conductive metal ohmically affixed to a regrown region of the device and having a junction area which is unusually free of cracks and crystal deformation.

The above objects and other advantages are provided by the method of the present invention and by the fused junction semiconductor devices which are produced by this method. According to the basic concept of the present invention, a novel improved method is provided for creating a fused junction semiconductor device by placing a metal specimen which may contain an active impurity and which includes a solvent metal in contact with the semiconductor body; heating the specimen and body to an elevated temperature which is above the melting point of the specimen and at which the solvent metal evaporates at a predetermined rate, the molten specimen thereby dissolving some semiconductor material from the adjacent region of the semiconductor body; and maintaining the specimen and body at the elevated temperature until a substantial portion of the solvent metal has evaporated, thereby causing a portion of the dissolved semiconductor material to precipitate together with some of the active impurity onto the semiconductor body to form a regrown region.

It will be noted that with the described method, a solidified alloy button of the type found in the prior art devices is never formed upon the regrown region. Instead, the solvent metal, which in prior art devices forms the bulk of the alloy button, is partially or wholly removed by the method step of evaporating the solvent metal from the semiconductor body. In view of the foregoing description of the several disadvantages of prior art devices arising from the presence of a solidified alloy button, it should be clear that semiconductor devices produced by the method of the present invention will have marked superiority in certain respects to prior art fused junction semiconductor devices.

A principal advantage is that fused junction semiconductor devices produced by the method of the present invention are remarkably and unusually free from cracks and crystal deformations in the junction area between the regrown region and the parent semiconductor body. In prior art devices, a certain number of cracks and other crystal flaws are almost always produced in the junction area because of the stresses caused by the solidification of an alloy pellet upon the parent semiconductor body. With the method of the present invention, substantially all of the solvent metal may be removed from the regrown region by evaporation, leaving a regrown region which is completely free of any solidified alloy pellet. As the solvent metal is evaporated off, substantially all the dissolved semiconductor material regrows onto the parent crystal in an orderly and organized fashion which does not produce any stresses that might cause cracks or flaws in the junction area, thereby producing a fused junction semiconductor device having improved electrical characteristics.

While removal through evaporation of substantially all of the solvent metal is a preferred step in the method of the present invention, it will be understood by those skilled in the art that even removal by evaporation of a portion of the solvent metal will decrease the thickness of the alloy button which will be formed, and thus greatly decrease the number of cracks and flaws in the junction area of the semiconductor device. It should therefore be understood that the method of the present invention contemplates either complete or partial removal by evaporation of the solvent metal from the regrown region which is formed.

In one form of the invention, the metal specimen which is to be fused to the semiconductor body contains a small quantity of an electrically conductive metal which has a relatively low rate of evaporation in comparison to the rate of evaporation of a relatively volatile solvent metal which is also contained in the metal specimen. When a specimen of the described type is melted in contact with the semiconductor body and then held at an elevated temperature, substantially all of the solvent metal may be evaporated off in a few minutes. As the solvent metal is removed through evaporation, the semiconductor material which has become dissolved in an alloy solution with the solvent metal, is forced to precipitate onto the parent semiconductor body to form a regrown crystal region. Finally, as removal by evaporation of the solvent metal continues, the electrically conductive metal is forced to precipitate upon the regrown region as a relatively thin cap ohmically affixed or connected to the regrown region.

The thinness of the cap may be readily controlled by limiting the amount of electrically conductive metal which is originally added to the metal specimen. It is a fairly simple matter to uniformly produce metal caps which are thin enough so that relatively little cracking of the junction area is caused by the solidification of the metal cap. With an ohmic contact thus established to the regrown region, external electrodes may be electrically connected to the regrown region either by soldering or bonding electrodes to the metal cap or by pressing resilient electrodes against the metal cap.

Generally, in fused junction semiconductor devices, an ohmic connection to the regrown region is desired and the described method has proven to be successful for producing a fully formed regrown region which is singularly free from cracks and crystal deformations and which is also capped by an ohmically affixed or connected electrically conductive electrode. However, it should be understood that it is also advantageous in some applications to produce a fused junction device in which the regrown region does not have an alloy pellet or electrically conductive cap affixed thereto and which presents to view only a clean and free surface of the regrown region. For example, such a device is desired as an intermediate product in the production of a transistor having a regrown base region. A transistor of this type is described in a copending United States application for patent entitled, "Fused Junction Transistor With Regrown Base Region," Serial No. 417,081, by Justice N. Carman, Jr., filed March 18, 1954.

In the prior art, regrown regions having free exposed surfaces could only be produced by methods which involved physical or chemical removal of an alloy pellet from the regrown region. Physical removal of an alloy pellet from a regrown region almost always caused crystal damage, while chemical removal of an alloy pellet usually involved the use of special etching treatments. However, with the method of the present invention, semiconductor devices having regrown regions with free exposed surfaces may be readily produced without difficulty.

Another great advantage of the method of the present invention is that it allows the use of solvent metals which are quite hard in the solid state and which have coefficients of expansion which are materially different from the coefficient of expansion of the semiconductor material which is being used. There are many solvent metals which in other respects would be excellent for use in the production of fused junction semiconductor devices, but which nevertheless have not been so used to any great extent because of these characteristics of hardness and differing coefficients of expansion. For example, antimony is a solvent metal for silicon. It is also an active donor impurity. It would appear that a P-N junction could readily be created in a P-type semiconductor body by fusing a pellet of antimony to the body. Antimony, when considered as a solvent metal for the production of fused junction semiconductor devices has the further advantage that it is relatively insoluble itself, in the solid state, in silicon and also that silicon is only slightly soluble in antimony. This low mutual solubility of silicon and antimony is of great advantage, as will be explained at a later point in the specification, in producing fused junction transistors having very close spacing between emitter and collector regions. Transistors with such physical configurations are ordinarily desired because of their superior electrical characteristics, particularly high-frequency response and high current amplification.

However, in spite of the many above described advantages of antimony as a solvent metal and doping agent for the production of fused junction semiconductor devices, antimony has never been used to any great extent in the production of fused junction devices because of its hardness and because of the variance in its coefficient of thermal expansion with respect to those of silicon and germanium and also because it evaporates somewhat too readily for use in prior art production methods. However, with the method of production of the present invention, none of the above characteristics of antimony present any bar to its use in the production of fused junction transistors. The hardness and differing coefficient of expansion of antimony are unimportant in the method of the present invention because the antimony may be almost totally removed from the semiconductor body through evaporation without ever creating a solidified alloy button on the semiconductor body. The relatively high volatility of antimony becomes a specific advantage in the method of the present invention.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

Figure 4A:
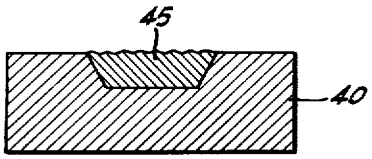

Fig. 4*a* is a sectional view of a fused junction semiconductor device in an intermediate stage of production illustrating the appearance of a free regrown region produced according to the method of the present invention.

Figure 4B:
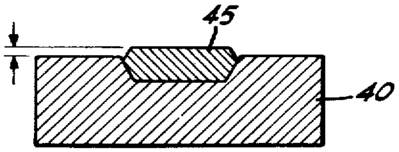

Fig. 4*b* is a schematic diagram, partly in section, of the fused junction semiconductor device shown in Fig. 4*a* illustrating the appearance of the free regrown region after chemical or electro-chemical etching treatment.

Figure 4C:
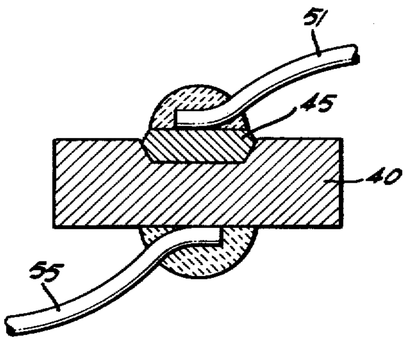

Fig. 4*c* is a schematic diagram, partly in section, of a completed fused junction semiconductor diode produced from the partially completed fused junction semiconductor device shown in Fig. 4*b*.

Figure 5A:
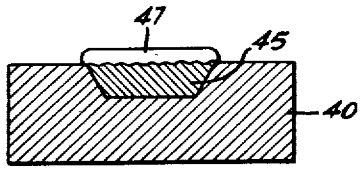

Fig. 5*a* is a sectional view of a fused junction semiconductor device in an intermediate stage of production illustrating the appearance of a regrown region having a thin electrically conductive cap produced according to the method of the present invention.

Figure 5B:
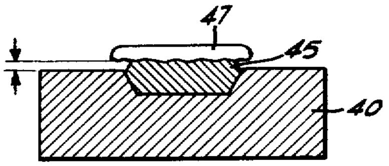

Fig. 5*b* is a schematic diagram, partly in section, of the fused junction semiconductor device shown in Fig. 5*a* illustrating the appearance of the regrown region and electrically conductive cap after chemical or electro-chemical etching treatment.

Figure 5C:
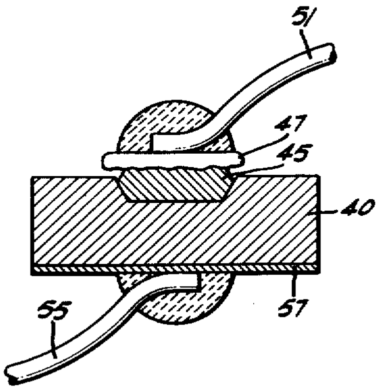

Fig. 5*c* is a schematic diagram, partly in section, illustrating the appearance of a completed fused junction semiconductor diode produced from the fused junction semiconductor device shown in Fig. 5*b*.

Figure 6:
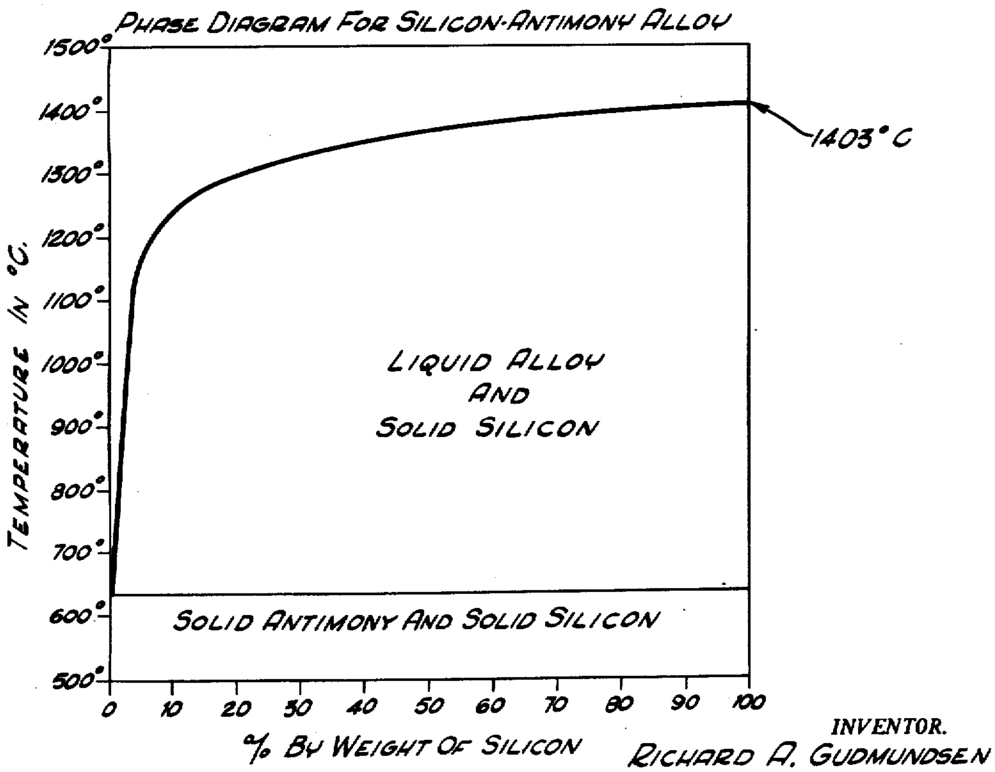

Fig. 6 is a graph which illustrates the liquid-solid equilibrium phase relationship between antimony and silicon for a range of temperatures between 500° C. and 1403° C.

Figs. 7*a* through 7*e* are schematic diagrams showing successive stages in the production of a fused junction transistor according to the method of the present invention.

Figure 1:
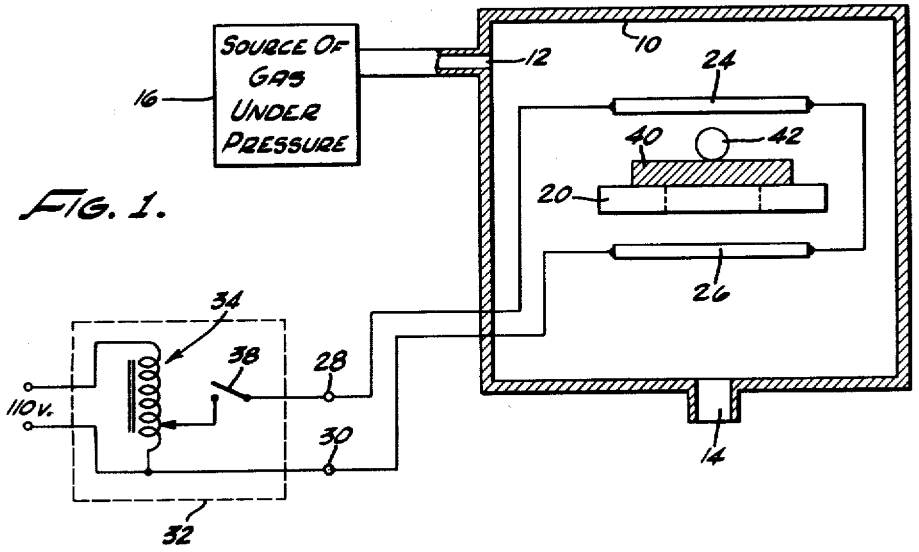
Fig. 1 is a schematic diagram, partly in section, of one form of apparatus for producing fused junction semiconductor devices according to the present invention.

Referring now to the drawings wherein like reference characters designate like or corresponding parts throughout the several views, there is shown in Fig. 1 one form of apparatus for producing fused junction semiconductor devices according to the methods of this invention. The apparatus comprises a heating chamber 10, having an intake port 12 and an exhaust port 14, the intake port being connected to a source 16 of gas under pressure. Positioned within chamber 10 is a crystal platform 20. The crystal platform may be supported within chamber 10 by any suitable supporting device, not shown for purposes of clarity. The apparatus also includes two heater elements 24 and 26, respectively, which are positioned adjacent opposite surfaces of platform 20 and are connected without chamber 10 to two output terminals 28 and 30, respectively, of an electrical power source 32.

Electrical power source 32 may include any conventional electrical circuit which is controllable for supplying a predetermined amount of electrical energy to heater elements 24 and 26. As shown in Fig. 1, for example, power source 32 includes an auto-transformer generally designated 34 which is connected across a 110-volt alternating-current source, as indicated, and to a switch 38 through which the potential output from auto-transformer 34 may be applied to heater elements 24 and 26.

For purposes of illustration, the operation of the apparatus shown in Fig. 1 will be described with respect to the production of fused junction silicon diodes and fused junction silicon transistors having P-type bodies and N-type regrown outer regions. It will be recognized, however, that the precise operational steps to be described may also be employed for producing germanium diodes and transistors and for producing semiconductor transistors and diodes having N-type bodies and P-type regrown regions.

In order to produce silicon fused junction semiconductor diodes having P-type bodies and N-type regrown regions, a P-type silicon semiconductor body 40 is first positioned on crystal platform 20 adjacent heater elements 24 and 26. Semiconductor body 40 is preferably a silicon single crystal which has been cut to a slab of predetermined thickness and which preferably has been crystallographically oriented so that its upper and lower surfaces, as viewed in Fig. 1, are the (111) surface planes of the crystal. Crystallographic orientation of the specimen is considered desirable to promote the growth of planar P-N junctions within the specimen during the fusion operation which will be described below. At the present, it appears to be preferable to employ the (111) surface plane for carrying out the method of this invention, the theory being that the relatively high atomic density of the crystal on this particular plane permits better control of subsequent operations. It should be pointed out, however, that other relatively dense crystallographic surface planes, such as the (110), (100), and (112) plane, may be employed satisfactorily in carrying out the methods of the invention.

When semiconductor body 4 has been properly positioned relative to heater elements 24 and 26, a metal specimen which might be in the form of a pellet 42 is positioned on the upper surface of semiconductor body 40, substantially as shown, preparatory to creating a fused junction in the specimen. Pellet 42 contains a solvent metal which is relatively volatile and may also include an active impurity. The fact that the pellet may contain both a volatile solvent metal and an active impurity does not necessarily imply that the pellet contains two distinct constituents. For example, it will be recognized by those skilled in the art that in a pellet of pure antimony, there is present both a relatively volatile solvent metal and an active impurity. A pellet of pure arsenic similarly satisfies these two requirements. On the other hand, the pellet may include two or more constituents. For example, a pellet containing cadmium as a solvent metal and small amount of phosphorus as an active donor impurity may be utilized in practicing the present invention, as will be more fully explained hereinafter.

Furthermore, where it is desired to produce regrown regions having electrically conductive caps affixed or connected thereto, small amounts of relatively non-volatile electrically conductive metals as, for example, gold or silver may be included in the specimen or pellet. The specific specimen constituents which are preferred for producing fused junction semiconductor devices according to the invention, and the reasons therefor will be described in more detail hereinafter. For the present, the description of the production of a fused junction semiconductor diode will be directed specifically to a pellet which contains either pure antimony (for the production of a free surface regrown region) or which contains a mixture of antimony and gold (to provide a regrown region having a gold cap ohmically affixed or connected thereto).

After pellet 42 has been placed upon semiconductor body 40, chamber 10 is filled with a suitable non-oxidizing gas, such as helium or hydrogen, from gas source 16 in order to surround the specimen with a dry non-oxidizing atmosphere, thereby preventing the formation of undesirable oxide films on the surface of the specimen during the subsequent steps in the methods of the invention. Switch 38 is then closed to supply electrical energy to the heater elements for raising the temperature of pellet 42 and semiconductor body 40 to a value of temperature above the melting point of pellet 42 but below the melting point of silicon semiconductor body 40. As the pellet melts, the liquid pellet tends to spread slightly to cover a small area of the semiconductor surface as it wets that surface and begins to dissolve the semiconductor material with which it comes into contact.

Figure 2:
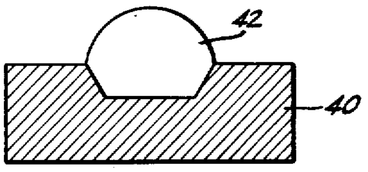
Fig. 2 is a schematic diagram, partly in section, of a semiconductor body and metal pellet illustrating one of the operational steps in producing fused junction transistors according to the invention.

The appearance of the assembly of body 40 and pellet 42 after pellet 42 has melted and has dissolved the adjacent region of the semiconductor body is illustrated in Fig. 2.

With a silicon semiconductor body, it is sometimes advisable to take steps to facilitate wetting of the semiconductor surface by the metal specimen by removing the film of silicon dioxide which is ordinarily found on the surface of a silicon body. Removal of the silicon dioxide film can be accomplished in a number of ways well known to the art, as by mechanical abrasion or through use of a suitable fluxing agent which may be previously applied to the semiconductor surface or may be included as an additional constituent of the metal specimen which is to be fused to the semiconductor surface. Suitable fluxing agents for inclusion in the metal specimen are fluoride salts of the alkali metals such as NaF, KF, CsF, LiF, and combinations thereof.

Referring still to Fig. 2, the amount of silicon which will be dissolved by molten pellet 42 is determined by the original amount and constituency of pellet 42 and by the temperature at which the described fusion operation is carried out. If it be assumed that pellet 42 consists originally entirely of pure antimony, then the amount of silicon which will be dissolved by a predetermined amount or weight of antimony at any temperature can best be determined by referring to the well-known binary phase diagram for the alloy of silicon and antimony which appears at page 441, volume II of the "International Critical Tables," published by McGraw-Hill Book Company (1927 edition), this binary phase diagram being substantially reproduced in Fig. 6. Fig. 6 then is the binary phase diagram for silicon and antimony in which is plotted the percentage amount by weight of silicon which can exist in phase equilibrium with antimony at various temperatures, against the temperatures at which the liquid mixture of silicon and antimony is maintained.

By referring to Fig. 6 it can be readily seen that an antimony pellet would melt at 630° C. and at 700° C. would dissolve an amount of silicon which has a weight of slightly less than 1% of the weight of the alloy pellet. At 850° C. dissolved silicon would constitute almost 2% of the weight of the molten pellet which is in phase equilibrium with the solid silicon body. It has been found in practicing the method of the present invention that a temperature range between 650° C. and 1100° C. yields satisfactory results.

Thus, it becomes clear that the amount of silicon which is dissolved is completely determined, assuming equilibrium conditions prevail, by the weight of the specimen pellet and by the temperature, thus allowing depth of penetration of the metal specimen into the semiconductor body to be controlled with some precision.

Figure 3:
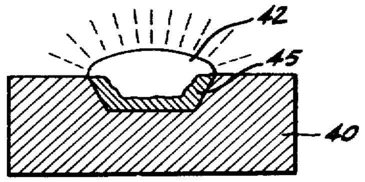
Fig. 3 is a sectional view of a fused junction semiconductor device in an intermediate stage of production according to the method of the present invention.

Referring now to Fig. 3, there is shown a sectional view of semiconductor body 40 and specimen 42 as they appear after considerable amounts of antimony have been removed through evaporation. As the antimony evaporates off, reducing the weight of antimony available as a solvent for silicon, some of the dissolved silicon can no longer remain in solution, and is forced to precipitate out of the solution. Ordinarily, precipitation of the silicon will occur upon the parent crystal body 40, and as evaporation of the antimony continues, the dissolved silicon will regrow upon the parent crystal body 40 in an orderly and organized fashion to form, as shown in Fig. 3, a regrown crystal region 45 which is heavily doped with substituted atoms of the active donor impurity, antimony, and therefore has an N-type conductivity.

Thus, as illustrated in Fig. 3, regrown region 45 is of a conductivity type opposite to that of the parent crystal body 40 which, it will be remembered, has P-type conductivity. At the interface between the N-type regrown region 45 and the P-type body 40, there exists a rectifying barrier which is the P-N junction between the two regions.

In practicing the method of the present invention, it is preferred that the antimony which is contained in specimen 42 be evaporated off at a constant or nearly constant temperature; that is, that the evaporation of the antimony be carried out isothermally. Substantially, isothermal evaporation of the antimony is preferred because then the amount of antimony which will deposit with the silicon in the regrown region, as substituted atoms in the crystal lattice of the regrown region, will be dependent in a simple manner solely upon the temperature which is maintained, and the initial weight of the specimen 42, rather than being dependent in a complicated manner upon such variables as the rate of evaporation of antimony and the rate of cooling or heating of the semiconductor body 40 and specimen 45, thereby permitting very exact control of the percentage of antimony doping impurity in the final regrown region.

Substantially isothermal evaporation of the antimony in specimen 42 may be obtained by rapidly raising the temperature of the specimen and body to a final value of temperature of approximately 850° C., there then being little opportunity for any substantial quantities of antimony to evaporate at lower temperatures because the final temperature is attained so rapidly. At 850° C. the antimony will have an evaporation rate of approximately $10^{-3}$ to $10^{-2}$ grams/centimeter$^2$/second, and once this temperature has been reached, it has been found that substantially all of the antimony will be removed through evaporation in a relatively short time. In some experiments it was found that with a starting specimen of approximately 20 milligrams, substantially all of the antimony had evaporated in approximately five minutes. However, although isothermal evaporation of the solvent metal in the metal specimen is a preferred feature of the present invention, it is not considered essential to the method of the present invention since excellent semiconductor devices may be produced without this feature, although accuracy of production control is somewhat impaired if the evaporation does not take place under isothermal conditions.

It is also a preferred feature of the present invention that substantially all of the solvent metal be removed from the semiconductor device through the described evaporative process since with complete removal of the solvent metal most of the difficulties are eliminated which have been experienced in the prior art with cracking of the crystal body caused by solidification of an alloy button. However, once again, although substantially complete removal of the solvent metal through evaporation is a preferred feature of the present invention, it is not considered to be an essential feature since greatly improved devices may be produced with even partial removal of the solvent metal.

It is felt that, fundamentally, the inventive feature of the present invention lies in the concept of using a relatively volatile solvent metal and evaporating the solvent metal to force a precipitation and regrowth of dissolved silicon or other semiconductor material onto a parent semiconductor body.

Referring now to Fig. 4*a*, there is shown a sectional view of the semiconductor device which was illustrated in Fig. 3 as it would appear after substantially all of the antimony had been evaporated off, it being assumed that the starting specimen 42 had comprised essentially pure antimony. Note in Fig. 4*a* that the surface of the regrown region 45 is completely free, exposing to view a crystal surface which is essentially an extension and continuation of the parent crystal body 40 and which does not have any alloy pellet or button affixed thereto.

In Fig. 5*a*, by way of comparison, however, there is shown a sectional view of the semiconductor device of Fig. 3 as it would appear after substantially all of the antimony had been evaporated off, if the starting specimen 42 had contained a small quantity of gold or other electrically conductive metal which is relatively nonvolatile in comparison with antimony. Gold, for example, at 850° C. has an evaporation rate which is less than $10^{-7}$ grams/centimeter$^2$/second, the volatility of gold therefore being approximately 4 order of magnitudes below that of antimony which, it will be remembered, has an evaporation rate of $10^{-3}$ grams/centimeter$^2$/second at 850° C. Thus, it is relatively easy to select a temperature at which substantially all of the antimony will evaporate while substantially all of the gold will fail to evaporate and will finally precipitate upon regrown region 45 to form an electrically conductive cap 47, as shown in Fig. 5*a*, which is ohmically affixed or connected to regrown region 45.

After those steps in the method of the present invention have been completed which result in the production of a free regrown region as shown in Fig. 4*a* or in the production of a regrown region having a thin electrically conductive cap ohmically affixed thereto, as in Fig. 5*a*, the remaining steps required for the production of a completed fused junction semiconductor device are relatively well-known to the art.

Figs. 4*b* and 4*c* illustrate succeeding steps that may be utilized to create a fused junction diode from the semiconductor body with free regrown region that is shown in Fig. 4*a*; while Figs. 5*b* and 5*c* illustrate successive steps which may be utilized in the production of a completed fused junction diode from the semiconductor body with a gold capped regrown region, as shown in Fig. 5*a*.

Figs. 4*b* and 5*b* illustrate the semiconductor devices of Figs. 4*a* and 5*a*, respectively, as they would appear after chemical or electro-chemical etching treatment. Treatment of the semiconductor surfaces with a chemical etchant serves the double purposes of improving the electrical characteristics of the surface of the semiconductor body and of removing imperfect crystal material which ordinarily is formed at the surface boundary between the parent crystal body and the regrown region and which if allowed to remain would short circuit the rectifying barrier between the two regions and would impair in other manner the electrical characteristics of the rectifying barrier. A suitable etching solution is a solution of 50 percent hydrofluoric acid and 50 percent nitric acid. Many other etching solutions which are equally suitable are well known to the art.

As shown in Fig. 4*b*, removal of imperfect crystal material by the chemical etchant causes a narrow groove to be formed at the surface boundary between the parent semiconductor body and the regrown region. Also, since the etching solution tends to attack N-type silicon less readily than P-type silicon, the top surface 50 of the regrown region, which is of P-type, protrudes slightly from the semiconductor device after completion of etching. As shown in Fig. 5*b*, where regrown region 45 has thin gold cap 47 ohmically affixed thereto, removal of crystal material by the etchant tends to undercut the gold cap so that there is no possibility of gold cap 47 shorting across the P-N junction between parent body 40 and regrown region 45. After etching treatment is completed, gold cap 47 overhangs the junction, as illustrated in Fig. 5*b*.

After etching treatment is completed it is only required to ohmically connect lead wires to the parent body 40 and to the regrown regions 45 in order to produce a completed semiconductor rectifier.

Referring now to Fig. 4*c*, a conductive lead 51 is shown ohmically affixed or connected to regrown region 45 by a drop of solder 53 which is doped with an active impurity of the class which also determines the conductivity type of regrown region 45. Doping of solder drop 53 in such manner is preferred since this tends to prevent creation of a rectifying barrier between solder drop 53 and the regrown region 45. A second conducting lead 55 is ohmically affixed to body 40 in the same manner. Fig. 4*c* therefore represents a completed fused junction rectifier.

Referring now to Fig. 5*c*, where the regrown region already has a gold cap ohmically affixed thereto, the difficulties which are ordinarily encountered in prior art devices in making ohmic connection to the regrown region are entirely avoided since a gold cap formed by the method of the present invention will invariably make excellent ohmic connection with the regrown region to which it is affixed. Conductor 51 may be readily affixed to gold cap 47 by means of a thermosetting gold paste. An alternative method of ohmically connecting conductor 55 to semiconductor body 40 is also illustrated in Fig. 5*c*. A thin film 57 is first formed on the surface of semiconductor 40 by evaporation or plating of the metal upon the body. Techniques for evaporating metals on a semiconductor body are described in copending application entitled "Junction Type Semiconductor Devices," Serial No. 387,274, by Harvey Stump, filed October 20, 1953.

Methods of plating metals upon semiconductor bodies are so well known to the art that further comment here is not required. It has been found that a plated film of rhodium will make an excellent ohmic contact with the semiconductor body. After film 57 has been established upon semiconductor body 40, conductor 55 may be readily affixed to the film by a vitreous conductive bond, as of thermosetting gold or silver paste.

Conductors 51 and 55 then make ohmic contact with the regrown region 45 and the parent semiconductor body, respectively, thereby completing a fused junction silicon diode. Fused junction silicon diodes of the type shown in Fig. 5*c* and produced according to the methods of the present invention have proved to have excellent electrical characteristics. Individual diodes have been produced having back resistances of the order of 100 megohms and having very low resistance to the passage of current in the forward direction. It is believed that the excellent electrical characteristics of these devices are caused by the singular perfection of the crystal structure in the neighborhood of the junction area; that is, the absence of cracks, dislocations, and other crystal defects in the neighborhood of the junction between the regrown region and the parent crystal body.

It will be clear to those skilled in the art that the methods of the present invention for the formation of fused P-N junctions may be utilized to produce other types of fused junction semiconductor devices having singularly perfect crystal formation in the region of the P-N junctions which may exist in such devices. The use of the method of the present invention is especially advantageous in the production of fused junction transistors having very close spacing between the emitter and collector regions.

Transistors with such configurations are ordinarily desired because of their superior electrical characteristics, particularly high frequency response, and high current amplification. The production, according to the methods of the present invention, of an N-P-N fused junction silicon transistor is illustrated in Figs. 7*a* to 7*e*. In the production of a transistor having close spacing between emitter and collector regions, semiconductor body 40 preferably includes an indentation or hole in one surface in order to provide a relatively thin or necked-down central region in the semiconductor body. The indentation may be produced, for example, by sand blasting the central region of one surface of the body until the body is of the order of 6 thousandths of an inch in thickness at that point, and then etching the sand blasted region to remove atomic debris and to further reduce the thickness to an order of 2 to 3 thousandths of an inch, thereby providing a region in the body where the fusion operation outlined below may be readily carried out to produce a fused junction transistor having extremely close spacing between the emitter and collector regions. The indentation also permits the semiconductor body which is, of course, relatively brittle to have a relatively thick, mechanically strong extremity for connection to an associated base electrode.

When the spacing between fusion formed emitter and collector regions is to be so close, it is desirable to use solvent metals which have low solid state solubility in silicon and in which silicon is only slightly soluble. In the prior art, for example, indium has been used as a solvent metal for germanium. Thus, in the prior art, where emitter and collector regions were to be positioned extremely close to one another, the indium which was used in the formation of these regions has tended to diffuse entirely across the intervening base region, thus short circuiting the emitter and collector regions. On the other hand, if silicon is readily soluble in the solvent metal which is used, the solvent metal may dissolve a passage entirely through the thin necked-down central region of the semiconductor body.

It is clear, therefore, that in the production of fused junction transistors, it is desirable to use a solvent metal which has relatively low mutual solubility with silicon or with germanium if a germanium semiconductor body is used, since if solvent metals having such characteristics are used, the regrown emitter and collector regions of the completed transistor will be very thin. Thus, the close spacing between the emitter and collector regions may be preserved without danger of short circuits being created between these regions.

In the production of a fused junction silicon transistor, antimony is an almost ideal solvent metal since it not only has low mutual solubility with silicon, but is also in itself an active impurity. When used as a solvent metal according to the method of the present invention, its hardness and unfavorable coefficient of expansion in the solid state are immaterial, thereby removing those objections which formerly barred the use of antimony as a solvent metal in the production of used junction transistors.

Figure 7A:
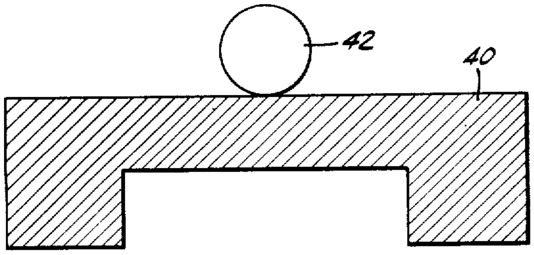

There will now be described in some detail the production of an N-P-N fused junction silicon transistor according to the methods of the present invention. First, as shown in Fig. 7*a*, a pellet 42 consisting essentially of 80% antimony and 20% gold is placed in contact with silicon body 40 at a point on one surface opposite the center of an indentation which has been created in semiconductor body 40 in the manner hereinbefore described.

Figure 7B:
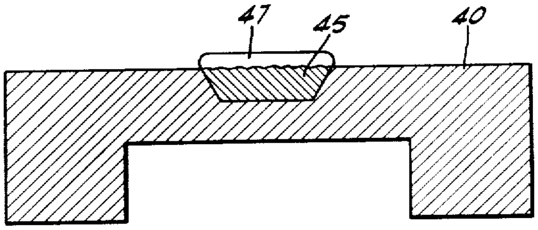

The temperature of the semiconductor body and the pellet is then rapidly raised to a temperature of the order of 850° C. whereupon the pellet 42 melts, dissolves a thin region of semiconductor body 40, and then as the antimony solvent metal is evaporated off redeposits the dissolved silicon to form a thin regrown region. Fig. 7*b* illustrates the appearance of the semiconductor device after the antimony has entirely evaporated. A regrown region 45 has been formed which is capped by a thin layer of gold 47 which has remained after the antimony evaporated. Regrown region 45 will serve as a collector region for the transistor which is to be formed.

Figure 7C:
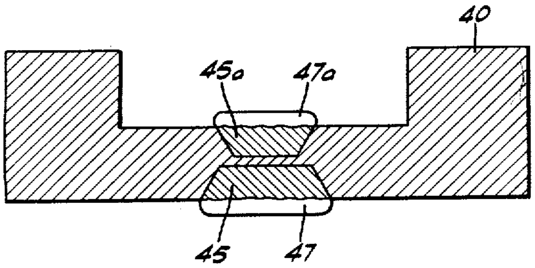

As shown in Fig. 7*c*, a somewhat smaller regrown emitter region 45*a*, capped by a gold layer 47*a*, may be formed on the opposite face of the semiconductor body 40 in the same manner which has been hereinbefore described. It will be understood that the antimony-gold pellet which is fused to the semiconductor body for the formation of emitter region 45*a* will ordinarily be somewhat smaller than that which is used in the formation of collector region 45, so that the two regions will have different areas, as shown in Fig. 7*c*.

Figure 7D:
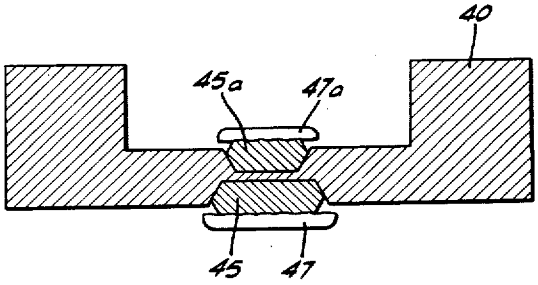

The next step in the production of the N-P-N silicon transistor is to etch the semi-completed transistor to improve the electrical characteristics of the surface, and to undercut the gold caps of the regrown regions to prevent any possibility of short circuits being formed between regrown regions 45*a* and 45 and the parent semiconductor body 40 which is the base region of the transistor. The appearance of the semi-completed transistor after the completion of the etching step is shown in Fig. 7*d*.

Figure 7E:
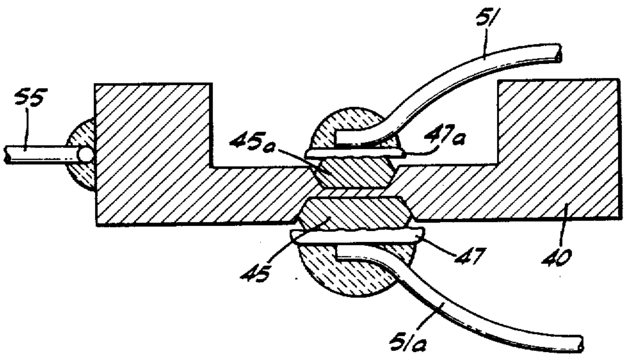

Referring now to Fig. 7*e*, there is shown a completed transistor. Lead wires 51 and 51*a* have been ohmically connected with a thermosetting gold paste to the gold caps on regrown regions 45 and 45*a*, respectively. Another conducting lead wire 55 is ohmically connected to the parent semiconductor body 40 which, as noted before, is the base region of the completed transistor. The completed N-P-N fused junction silicon transistor shown in Fig. 7*e* is characterized by high current amplification because of the extremely close spacing between emitter and collector regions, and also has other improved electrical characteristics occasioned by the singular perfection of the crystal formation in the neighborhood of the junctions.

Although in the foregoing description formation of fused junctions through the use of antimony as the solvent metal has been particularly described, it will be recognized by those skilled in the art that other solvent metals may be used which are similarly characterized by relatively high volatility and by a relatively low melting point. At the present time, for the production of silicon devices, solvent metals having melting points below 900° C. are preferred since in the present state of the art temperatures above 900° C. appear to adversely injure the electrical characteristics of silicon, although temperatures in excess of 900° C. may be satisfactorily used where longevity of carrier lifetime of the silicon is not a primary consideration. Also, improvements in annealing treatments and other improvements may, as the art advances, raise the permissible temperatures to which silicon may be subjected and, therefore, it is desired that the scope of the present application be restricted only to the use of solvent metals which have melting points below that of silicon (approximately 1400° C.). Another solvent metal other than antimony which has the foregoing required characteristics and is eminently suitable for use in the formation of fused junction silicon devices according to the method of the present invention, is cadmium, which has a melting point of 321° C., and has an evaporation rate at this temperature of approximately $10^{-3}$ grams/centimeter$^2$/second. It has been found that in using cadmium as a solvent metal an evaporation temperature in the range of 550° C. to 1100° C. yields satisfactory results. When cadmium is used as a solvent metal, active impurities should be added to the solvent metal specimen since cadmium is not itself a known active impurity.

Similarly, zinc, which melts at 419° C., and which also has a rate of evaporation at its melting point of approximately $10^{-3}$ grams/centimeter$^2$/second, is a suitable choice for a solvent metal in the production of fused junction devices according to the method of the present invention. Calcium, which also exhibits high volatility and has a melting point of 810° C., may be useful as a solvent metal when suitably alloyed to decrease its volatility. Arsenic, which melts at 820° C., is highly volatile, is also an active impurity, and may also be utilized as a solvent metal in the practice of the method of the present invention. Arsenic, however, is not greatly preferred in the practice of the present invention because of the dangers inherent in its high toxicity.

It should be expressly understood that numerous other modifications and alterations may be made in the invention herein disclosed. For example, the temperatures at which the various processes are carried out may be varied over relatively wide limits. Also, where an active impurity is to be added, it should be expressly understood that the impurity need not be initially included in the metal specimen which is to be fused to a semiconductor body but may instead be applied directly to the surface of the semiconductor body in the form of a paste or solution and later incorporated in the metal specimen as the specimen melts.

What is claimed as new is:

1. In the method of producing in a body of semiconductor material selected from the group consisting of germanium and silicon an integral regrown region separated from the parent semiconductor body by a rectifying barrier to obtain a fused junction semiconductor device, the method comprising the steps of: placing a metal specimen which includes a solvent metal in contact with a region of the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to said elevated temperature and at which the solvent metal evaporates at said predetermined rate, whereby the molten specimen dissolves semiconductor material from the region of the semiconductor body, and maintaining the specimen and the body at said elevated temperature until at least a major portion of the solvent metal has evaporated, thereby causing a portion of the dissolved semiconductor material to precipitate onto the parent semiconductor body to form the regrown region separated from the parent body by a rectifying barrier.

2. The method defined by claim 1 wherein substantially all of said solvent metal is evaporated from said semiconductor body during said step of maintaining said specimen and said body at said elevated temperature.

3. The method defined by claim 1 wherein said solvent metal is antimony and the semiconductor material is silicon.

4. The method defined by claim 1 wherein said metal specimen also includes an electrically conductive metal which has relatively low volatility in comparison to the volatility of said solvent metal, and wherein said step of maintaining the specimen and body at the elevated temperature includes the additional step of maintaining the specimen and the body at the elevated temperature after the regrown region has been formed until the electrically conductive metal has precipitated upon the regrown region to form a thin cap of the electrically conductive metal which is ohmically connected to the regrown region.

5. The method defined by claim 1 wherein said metal specimen also includes an active impurity of the type which determines the conductivity type of the regrown region whereby said molten specimen includes both dissolved semiconductor material and atoms of the active impurity, and whereby said step of maintaining the specimen and the body at the elevated temperature causes the dissolved semiconductor material to precipitate with some substituted atoms of the active impurity onto the semiconductor body to form a regrown region of opposite conductivity type to said parent semiconductor body.

6. The method defined by claim 5 wherein substantially all of the solvent metal is removed by evaporation during said step of maintaining the specimen and the body at the elevated temperature.

7. The method defined by claim 5 wherein the specimen includes an electrically conductive metal which has relatively low volatility in comparison to the volatility of the solvent metal whereby the molten specimen includes dissolved semiconductor material, atoms of the active impurity, and the electrically conductive metal, whereby after the dissolved semiconductor material precipitates with some substituted atoms of the active impurity onto the semiconductor body to form a regrown region of a conductivity type opposite to that of the parent semiconductor body, and whereby the electrically conductive metal precipitates on the regrown region to form a thin cap of the electrically conductive metal which is ohmically connected to the regrown region.

8. In the method of producing, in a body of semiconductor material selected from the group consisting of germanium and silicon of one conductivity type, an integral regrown region of opposite conductivity type separated from the parent semiconductor body by a P-N junction to obtain a fused junction semiconductor device, the method comprising the steps of: placing a metal specimen containing an active impurity and including a solvent metal in contact with the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to said elevated temperature and at which the solvent metal evaporates at said predetermined rate whereby the molten specimen dissolves semiconductor material from the adjacent region of the semiconductor body, and maintaining the specimen and the body at said elevated temperature until at least a major portion of the solvent metal has evaporated, thereby causing a portion of the dissolved semiconductor material to precipitate with some of the active impurity onto the parent semiconductor body to form the regrown region.

9. In the method of producing, in a body of semiconductor material selected from the group consisting of germanium and silicon of one conductivity type, an integral regrown region of opposite conductivity type separated from the parent semiconductor body by a P-N junction and having a cap of an electrically conductive metal ohmically affixed to the regrown region, to obtain a fused junction semiconductor device, the method comprising the steps of: placing a metallic alloy specimen, containing an active impurity and including the electrically conductive metal and a solvent metal, in contact with the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to said elevated temperature and at which the solvent metal evaporates at said predetermined rate which is relatively large compared to the rate of evaporation of the electrically conductive metal, whereby the molten alloy specimen dissolves semiconductor material from the adjacent region of the semiconductor body, and maintaining the specimen and the body at said elevated temperature until substantially all of the solvent metal has evaporated, thereby causing a portion of the dissolved semiconductor material to precipitate with some of the active impurity onto the parent semiconductor body to form the regrown region and causing the electrically conductive metal to precipitate upon the regrown region to form the ohmically affixed cap.

10. In the method of producing, in a body of semiconductor material selected from the group consisting of germanium and silicon of one conductivity type, an integral regrown region of opposite conductivity type separated from the parent semiconductor body by a P-N junction to obtain a fused junction semiconductor device, the method comprising the steps of: placing a metal specimen containing an active impurity and a solvent metal in contact with the surface of a region of the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and the body to melt the specimen and to dissolve the region of the semiconductor body in the molten specimen to form a molten alloy drop containing the solvent metal and dissolved semiconductor material and including the active impurity, evaporating substantially all of the solvent metal from the alloy drop to remove the solvent metal, thereby to cause substantially all of the dissolved semiconductor material to precipitate with some of the active impurity onto the parent semiconductor body to form an integral regrown crystal region of a conductivity type opposite to that of the parent crystal body separated by a P-N junction from the parent crystal.

11. The method defined by claim 10 wherein the metal specimen includes an electrically conductive metal which has relatively low volatility in comparison to the volatility of the solvent metal, whereby said molten alloy drop, when it is formed, contains the electrically conductive metal, and whereby said step of evaporating substantially all of the solvent metal from the alloy drop also causes the electrically conductive metal to precipitate upon the regrown region to form a thin cap of the electrically conductive metal which is ohmically affixed to the regrown region.

12. In the method of producing, in a body of silicon, an integral regrown region separated from the parent body of silicon by a rectifying barrier to obtain a fused junction semiconductor device, the method comprising the steps of: placing a metal specimen which includes antimony in contact with the region of the silicon body, heating the specimen and body to an elevated temperature above the melting point of the specimen and below the melting point of the silicon body, and at which the antimoney evaporates at a predetermined rate, whereby the molten specimen dissolves some silicon from the region of the silicon body, and maintaining the specimen and the body at the elevated temperature until at least a major portion of the antimony has evaporated, thereby forcing the dissolved silicon to precipitate onto the parent crystal body to form the regrown region.

13. The method defined by claim 12 wherein the metal specimen also includes a quantity of gold, whereby said step of maintaining the specimen of the body at the elevated temperature causes the gold to precipitate upon the regrown region as a thin gold cap ohmically affixed to the regrown region.

14. The method defined by claim 13 which includes the additional step of etching the regrown region and adjacent regions of the silicon body to remove damaged crystalline material from the regrown region and adjacent regions of the silicon body and to undercut the gold cap, thereby preventing the gold cap from electrically short circuiting the rectifying boundary between the regrown region and the parent semiconductor body.

15. In the method of producing, in a body of silicon of one conductivity type, an integral regrown region of silicon of opposite conductivity type separated from the parent body of silicon by a P-N junction to obtain a fused junction semiconductor device, the method comprising the steps of: placing a specimen of antimony in contact with the region of the silicon body, heating the specimen of antimony and the body of silicon to an elevated temperature in the range of 650° C. to 1100° C., whereby the molten antimony dissolves some silicon from the region of the silicon body, and maintaining the specimen of antimony and the body of silicon at the elevated temperature until at least a major portion of the antimony has evaporated, causing the dissolved semiconductor material to precipitate with some substituted atoms of antimony as an active impurity onto the semiconductor body to form the regrown region of opposite conductivity type to the parent silicon body.

16. In the method of producing, in a body of silicon of one conductivity type, an integral regrown region of silicon of opposite conductivity type separated from the parent body of silicon by a P-N junction to obtain a fused junction semiconductor device, the method comprising the steps of: placing a specimen of cadmium, containing phosphorus as an active impurity, in contact with the silicon body, heating the specimen of cadmium and the body of silicon to an elevated temperature in the range of 550° C. to 1100° C., at which the solvent metal evaporates at a predetermined rate, whereby the molten cadmium dissolves silicon from the adjacent region of the silicon body, and maintaining the specimen of cadmium and the body of silicon at the elevated temperature until substantially all of the cadmium is evaporated from the silicon body, thereby causing a portion of the dissolved silicon material to precipitate with some of the phosphorus atoms as an active impurity onto the parent silicon body to form the regrown region of opposite conductivity type.

17. A fused junction semiconductor device comprising a body of semiconductor material selected from the group consisting of germanium and silicon, and an integral regrown region separated from the parent semiconductor body by a rectifying barrier, made by the method of placing a metal specimen which includes a solvent metal in contact with a region of the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to an elevated temperature above the melting point of the specimen and below the melting point of the semiconductor body and at which the solvent metal evaporates at said predetermined rate, and maintaining the specimen and the body at the elevated temperature until at least a major portion of the solvent metal has evaporated, thereby causing a portion of the dissolved semiconductor material to precipitate onto the parent semiconductor body to form the regrown region separated from the parent body by a rectifying barrier.

18. A fused junction semiconductor device comprising a body of semiconductor material selected from the group consisting of germanium and silicon of one conductivity type, an integral regrown region of opposite conductivity type, and a P-N junction separating the integral regrown region from the parent semiconductor body made by the method of placing a metal specimen, containing an active impurity and including a solvent metal, in contact with the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to an elevated temperature, above the melting point of the specimen and below the melting point of the semiconductor body at which the solvent metal evaporates at said predetermined rate, whereby the molten specimen dissolves semiconductor material from the adjacent region of the semiconductor body, and maintaining the specimen and the body at the elevated temperature until at least a major portion of the solvent metal has evaporated, thereby causing a portion of the dissolved semiconductor material to precipitate with some of the active impurity onto the parent semiconductor body to form the regrown region separated from the parent body by a P-N junction.

19. A fused junction semiconductor device comprising a body of semiconductor material selected from the group consisting of germanium and silicon of one conductivity type, an integral regrown region of opposite conductivity type, a P-N junction separating the integral regrown region from the parent semiconductor body, and a cap of electrically conductive metal ohmically affixed to the regrown region, made by the process of placing a metallic alloy specimen, containing an active impurity and including an electrically conductive metal and a solvent metal, in contact with the semiconductor body, said solvent metal having a predetermined evaporation rate of at least approximately $10^{-3}$ grams/square centimeter/second at an elevated temperature above the melting point of the solvent metal but below the melting point of the semiconductor body, heating the specimen and body to an elevated temperature above the melting point of the alloy specimen and at which temperature the solvent metal evaporates at said predetermined rate which is relatively large compared to the rate of evaporation of the electrically conductive metal, whereby the molten specimen dissolves semiconductor material from the adjacent region of the semiconductor body, and maintaining the specimen and the body at an elevated temperature until substantially all of the solvent metal has evaporated, thereby causing a portion of the dissolved semiconductor material to precipitate with some of the active impurity onto the parent semiconductor body to form the regrown region, and causing the electrically conductive metal to precipitate upon the regrown region to form the ohmically affixed cap.

References Cited in the file of this patent

UNITED STATES PATENTS

| | | |
|---|---|---|
| 2,569,347 | Shockley | Sept. 25, 1951 |
| 2,644,852 | Dunlap | July 7, 1953 |
| 2,708,646 | North | May 17, 1955 |

UNITED STATES PATENT OFFICE

CERTIFICATE OF CORRECTION

Patent No. 2,815,304 December 3, 1957

Richard A. Gudmundsen

It is hereby certified that error appears in the printed specification of the above numbered patent requiring correction and that the said Letters Patent should read as corrected below.

Column 7, line 47, for "4" read -- 40 --; column 12, line 56, for "used" read -- fused --; column 16, lines 45 and 46, for "antimoney" read -- antimony --.

Signed and sealed this 25th day of February 1958.

(SEAL)
Attest:
KARL H. AXLINE
Attesting Officer

ROBERT C. WATSON
Commissioner of Patents